United States Patent [19]
Hata et al.

[11] Patent Number: 5,982,024
[45] Date of Patent: Nov. 9, 1999

[54] HIGH CONCENTRATION DOPED SEMICONDUCTOR

[75] Inventors: Masahiko Hata, Tsuchiura; Yuichi Sasajima, Tsukuba, both of Japan

[73] Assignee: Sumitomo Chemical Company Limited, Osaka, Japan

[21] Appl. No.: 08/807,394

[22] Filed: Feb. 27, 1997

[30] Foreign Application Priority Data

Feb. 29, 1996 [JP] Japan ................................. 8-043725

[51] Int. Cl.⁶ .................................................. H01L 23/58
[52] U.S. Cl. .......................... 257/655; 257/12; 257/194; 257/609
[58] Field of Search ............... 257/655, 12, 26, 257/194, 192, 609

[56] References Cited

U.S. PATENT DOCUMENTS

| | | | |
|---|---|---|---|
| 4,484,207 | 11/1984 | Nishizawa et al. | 257/192 |
| 4,686,550 | 8/1987 | Capasso et al. | 257/655 |
| 5,266,818 | 11/1993 | Tsuda et al. | |

FOREIGN PATENT DOCUMENTS 430 595 A1   6/1991   European Pat. Off. .

OTHER PUBLICATIONS

Tokumitsu, Japanese Journal of Applied Physics, vol. 69, No. 5, pp. L698–L700, May 1990.
Eisuke Tokumitsu, "Correlation Between Fermi Level Stabilization Positions and Maximum Free Carrier Concentration in III–V Compound Semiconductors," Japanese Journal of Applied Physics, vol. 29, No. 5, May 1990, pp. L698–L701.
R. C. Newman, "The Lattice Locations of Silicon Impurities in GaAs: Effects Due to Stoichiometry, The Fermi Energy, The Solubility Limit and DX Behavious," Semiconductor Science and Technology, vol. 9, No. 10, Oct. 1994, pp. 1749–1762.
A. R. Clawson, "MOCVD Grown Si–Doped n⁺InP Layers for the Subcollector Region in HBTs," Proceedings of the International Conference on Indium Phosphide and Related Materials, Santa Barbara, March 27–31, 1994, Conf. No. 6, Mar. 27, 1994, Institute of Electrical and Electronics Engineers, pp. 114–117.
W. A. Harrison et al., "Tight–Binding Theory of Heterojunction Band Lineups and Interface Dipoles," Journal of Vacuum Science and Technology, Part B, vol. 4, No. 4, Jul. 1986, pp. 1068–1073.

*Primary Examiner*—Sara Crane
*Attorney, Agent, or Firm*—Pillsbury Madison & Sutro

[57] ABSTRACT

A semiconductor comprising an n-type semiconductor layer 1 with donor impurities added thereto, a semiconductor layer 2 having the value of energy from vacuum level to Fermi level larger than the value of energy from vacuum level to the lower end of the conduction band of the n-type semiconductor 1 and a junction connected to said semiconductor layer 2, characterized in that the donor impurities concentration ($N_d$) in the range of thickness of the depletion layer generated in said n-type semiconductor layer 1 in contact with the junction boundary is at least $$2.7 \times 10^3 \exp\{-5.5(E_C - E_{FS})\} \times N_C$$

(where $E_C$ is the energy value in eV from the upper end of the valence band to the lower end of the conduction band of the n-type semiconductor 1, $E_{FS}$ is the energy value in eV from the upper end of the valence band to the charge neutrality level of the n-type semiconductor 1, and $N_C$ is the effective density of states in cm⁻³ of the conduction band of the n-type semiconductor 1).

The present invention provides a semiconductor doped with a doping concentration higher than that has been considered as the basic limit of doping concentration in semiconductors and a method of fabricating such a semiconductor, thereby making it possible to enhance the semiconductor design freedom and widen the range of semiconductor applications.

15 Claims, 5 Drawing Sheets

Ordinate (right) : V t (threshold voltage ; V)
Ordinate (left) : N s (sheet electron concentration ; /cm$^2$)
Abscissa : Si doping rate in (/cm$^3$)

HIGH CONCENTRATION DOPED SEMICONDUCTOR

BACKGROUND OF THE INVENTION

1. Field of the Invention

The present invention relates to a semiconductor doped with impurities, and in particular to a semiconductor doped with impurities with high concentration and a method for fabricating such a semiconductor.

2. Description of the Related Art

The high-concentration doping of impurities is an important technique for semiconductor devices. Compounds such as GaAs and AlGaAs used for fabricating high-speed devices, for example, are doped to the extent of 3 to $5 \times 10^{18}/cm^3$ using Si as n-type impurities with a low diffusion coefficient and high in thermal stability. Such a high-concentration doped layer is used as an electrode lead-out layer (GaAs) for the field effect transistor or the bipolar transistor and also as an electron donor layer (AlGaAs) for the hetero-junction field effect transistor utilizing the modulation doped structure, and thus has contributed to an improved device performance.

With the recent trend to an ever-smaller size and an ever-higher performance of the devices, however, a reduced element resistance is assuming an increasing importance. Under the circumstances, there is a growing demand for reduction in the channel resistance of the hetero-junction field effect transistor and in the electrode contact resistance of various transistors. Thus, an even higher-concentration doping is sought after.

The impurities doping has a metallurgical solution limit. In the case where the solution limit of impurities is exceeded in a semiconductor material providing a base, the impurity induced phase separation or extreme deterioration of crystallinity is caused. The solution limit of various impurities has been examined with comparative frequency for representative semiconductors.

With an impurities concentration far lower than the metallurgical solution limit, on the other hand, it is actually known that the saturation of electron concentration occurs.

Although the Si impurities are dissolved in GaAs to the extent of $5 \times 10^{19}/cm^3$ or more, for example, it is generally known that about $5 \times 10^{18}/cm^3$ is an actual limit as an active donor. The Si concentration coincides with the electron density for lessthantheactual limit value. Fortheactual limit or more, however, the electron concentration is known to saturate or assume a lower value in spite of an increased Si concentration.

This concentration saturation has been studied for various semiconductors. Tokumitsu, et al. have studied the maximum electron concentration for the various semiconductors reported in the past and have discovered that the value of the maximum electron concentration is closely related to the charge neutrality level, which is referred to as the "Fermi level stabilization energy" in the Tokumitsu, et al. papers, and the energy position of the conduction band or the valence band in each semiconductor. (Japanese Journal of Applied Physics, Vol.29, No.5, L698–L701, 1990)

From the result of the above-mentioned study, it has been found that the saturation of the electron (hole) concentration in a semiconductor has a close relation with the Fermi level of the particular semiconductor system. Specifically, although the Fermi level of an n-type semiconductor increases due to the doping, actually there exists an upper limit of the Fermi level, beyond which any effort of doping results in the compensation effect due to the generation of an inherent defect and the electron concentration is saturated virtually at a fixed value.

This model explains clearly the well-known fact that the saturation concentration of a semiconductor having a large forbidden gap is small and that the compensation phenomenon due to an inherent defect (self-compensation effect) is liable to occur. In fact, experiments have also confirmed that high-concentration Ga vacancy or related defects (acceptors) are generated with the increase in the doping concentration of GaAs or AlGaAs.

Also, even in the case where Si is added to GaAs at the saturation concentration or more, for example, the vacancy or related defects are not generated and Si enters the donor site by adding acceptors and thus reducing the Fermi level at the same time. This substantiates the importance of the Fermi level for activation of Si as a donor.

The empirical formulae reported by Tokumitsu, et al. are described below.

In the case of n-type semiconductor:

$$n/N_C = 2.7 \times 10^3 \exp(-5.5(E_C - E_{FS})) \tag{1}$$

In the case of p-type semiconductor:

$$p/N_V = 4.0 \times 10^3 \exp(-6.1(E_{FS} - E_V)) \tag{2}$$

where n is the effective donor concentration (in $cm^{-3}$), p is the acceptor concentration (in $cm^{-3}$), $N_c$ is the effective density of states of the conduction band (in $cm^{-3}$), Nv is the effective density of states of the valence band (in $cm^{-3}$), $E_C$ is the energy value (in eV) from the upper end of the valence band to the lower end of the conduction band, and $E_{FS}$ is the energy value (in eV) from the upper end of the valence band to the charge neutrality level.

Also, $E_V$ indicates the energy value at the upper end of the valence band. Since this energy value is used as a reference, it is given as $E_V = 0$ (eV). The value of $E_{FS} - E_V$ is given from Table 1 (p.2756) described in Physical Review Letters Vol.56, No.25, p.2775–2758 (1996), by J. Tersoff.

The value of $E_{FS}$ is known to be 0.5 eV for GaAs and 1.05 eV for AlAs, for example.

For other substances not described in the above-mentioned reference, the hybridized orbital energy value ($_\epsilon h - _\epsilon V$) in Table 1 (p.1070) described in Journal of Vacuum Science and Technology B4(4), p.1068–1073 (1986), by W. A. Harrison and J. Tersoff, can be used as the value of $E_{FS} - E_V$.

With regard to the mixed crystal semiconductors, on the other hand, the value of $E_{FS}$ can be calculated using Vegard's Rule from the values of semiconductors of various configurations and the composition ratio thereof.

The empirical formulae (1) and (2) described in the above-mentioned references have so far been widely considered to provide a basic concentration limit for well-known semiconductors.

In order to realize a still higher-concentration doping, on the other hand, several attempts have been made. Taking into consideration the fact that the self-compensation in GaAs triggers the generation of Ga vacancy, for example, the Si doping to the extent of $2 \times 10^{19}/cm^3$ has been realized by low-temperature crystal growth without giving the activation energy required for generation of Ga vacancy. A high-concentration doping is realized also by planar doping different from normal doping. (Review "Semiconductor Science and Technology, 9", p.1749–1762 (1994), by R. C. Newman)

It has been shown, on the other hand, that the impurities are readily diffused by heat treatment in these high-concentration doped crystals and their qualities are affected. In all of the above-mentioned methods, the semiconductor is fabricated under a highly non-equilibrium condition, and therefore the semiconductor is not thermally stable. Thus there has been a demand for a thermally stable semiconductor doped with a concentration higher than the conventional limit.

In the case of GaAs or AlGaAs, for example, a high-concentration doped semiconductor that can be fabricated preferably at not lower than 550° C., or more preferably, at not lower than 600° C. and a method of fabrication thereof have been sought after.

SUMMARY OF THE INVENTION

The object of the present invention is to break through what has thus far been considered the basic limit of doping concentration in semiconductors and to provide a semiconductor doped with a doping concentration higher than specified in formulae (1) and (2) and a method of fabricating such a semiconductor, thereby making it possible to enhance the semiconductor design freedom and widen the range of semiconductor applications.

In view of the above-mentioned problem points, the present inventors, as a result of repeatedly studying the doping of semiconductors, have found that the electron concentration of a semiconductor is saturated at a predetermined limit as described above. In the case where the intended semiconductor is brought into contact with a semiconductor of different properties, however, a different phenomenon occurs at the junction region causing a change in the electron concentration limit.

As a result of a more detailed study, the inventors have found the following fact. Specifically, consider a semiconductor containing an n-type semiconductor. In the case where a second semiconductor having a large electron affinity as compared with the n-type semiconductor is junctioned with the n-type semiconductor, it has been found that the effective electron concentration of the n-type semiconductor can be increased beyond the conventionally-known saturation value in the neighborhood of the junction.

[1] More specifically, the present invention relates to a semiconductor comprising an n-type semiconductor layer 1 with donor impurities added thereto, which includes a junction with a semiconductor layer 2 having an energy value from vacuum level to Fermi level larger than the energy value from vacuum level to the lower end of the conduction band of the n-type semiconductor 1, and in which the donor impurities concentration ($N_d$) in the range of thickness of the depletion layer generated in the n-type semiconductor layer 1 in contact with the junction boundary is at least $$2.7\times10^3\exp\{-5.5(E_C-E_{FS})\}\times N_C$$

(where $E_C$ is the energy value in eV from the upper end of the valence band to the lower end of the conduction band of the n-type semiconductor 1, $E_{FS}$ is the energy value in eV from the upper end of the valence band to the charge neutrality level of the n-type semiconductor 1, and $N_C$ is the effective density of states in cm$^{-3}$ of the conduction band of the n-type semiconductor 1)

[2] Secondly, the present invention relates to a method of fabricating a semiconductor having an n-type semiconductor layer 1 with donor impurities added thereto, as described in [1] above, in which a semiconductor layer 2 having the energy value from vacuum level to Fermi level larger than the energy value from vacuum level to the lower end of the conduction band of the n-type semiconductor 1 with the donor impurities added thereto is junctioned with the n-type semiconductor 1, and donor impurities are doped in such a manner that the donor impurities concentration ($N_d$) in the range of thickness of the depletion layer generated in the n-type semiconductor layer 1 in contact with the junction boundary is at least $$2.7\times10^3\exp\{-.5.5(E_C-E_{FS})\}\times N_C$$

(where $E_C$, $E_{FS}$ and $N_C$ are defined the same as in [1]).

[3] Further, the present invention relates to a semiconductor comprising an n-type semiconductor layer 1 with donor impurities added thereto, which includes a hetero-junction with a semiconductor layer 2' having an energy value from vacuum level to the lower end of the conduction band larger than the energy value from vacuum level to the lower end of the conduction band of the n-type semiconductor 1, and in which the donor impurities concentration ($N_d$) in the range of thickness of the depletion layer generated in the n-type semiconductor layer 1 in contact with the junction boundary is at least $$2.7\times10^3\exp\{-5.5(E_C-E_{FS})\}\times N_C$$

(where $E_C$ is the energy value in eV from the upper end of the valence band to the lower end of the conduction band of the n-type semiconductor 1, $E_{FS}$ is the energy value in ev from the upper end of the valence band to the charge neutrality level of the n-type semiconductor 1, and $N_C$ is the effective density of states in cm$^{-3}$ of the conduction band of the n-type semiconductor 1)

[4] Also, the present invention relates to a method of fabricating a semiconductor comprising an n-type semiconductor layer 1 with donor impurities added thereto, as described in [3] above, in which a semiconductor layer 2' having the energy value from vacuum level to the lower end of the conduction band larger than the energy value from vacuum level to the lower end of the conduction band of the n-type semiconductor 1 with the donor impurities added thereto is hetero-junctioned with the n-type semiconductor 1, and donor impurities are doped in such a manner that the donor impurities concentration ($N_d$) in the range of thickness of the depletion layer generated in the n-type semiconductor layer 1 in contact with the junction boundary is at least $$2.7\times10^3\exp\{-5.5(E_C-E_{FS})\}\times N_C$$

(where $E_C$, $E_{FS}$ and $N_C$ are defined the same as in [3]).

[5] Further, the present invention relates to a semiconductor comprising a p-type semiconductor layer 3 with acceptor impurities added thereto, which includes a junction connected with a semiconductor layer 4 having an energy value from vacuum level to Fermi level smaller than the energy value from vacuum level to the lower end of the conduction band of the p-type semiconductor 3, and in which the acceptor impurities concentration ($N_a$) in the range of thickness of the depletion layer generated in the p-type semiconductor layer 3 in contact with the junction boundary is at least $$4.0\times10^3\exp\{-6.1(E^{FS}-E_V)\}\times N_V$$

(where $E_{FS}$ is the energy value in eV from the upper end of the valence band to the charge neutrality level of the p-type semiconductor 3, $E_V$ is the energy value in eV at the upper end of the valence band, and $N_V$ is the effective density of states in cm$^{-3}$ of the valence band of the p-type semiconductor 3)

[6] Further, the present invention relates to a method of fabricating a semiconductor comprising an p-type semiconductor layer 3 with acceptor impurities added thereto, as described in [5] above, in which a semiconductor layer 4 having an energy value from vacuum level to Fermi level smaller than the energy value from vacuum level to the lower end of the conduction band of the p-type semiconductor 3 with acceptor impurities added thereto is junctioned with the p-type semiconductor 3, and acceptor impurities are doped in such a manner that the acceptor impurities concentration ($N_a$) in the range of thickness of the depletion layer generated in the p-type semiconductor 3 in contact with the junction boundary is at least $$4.0\times10^3\exp\{-6.1(E_{FS}-E_V)\}\times N_V$$

(where $E_{FS}$, $E_V$ and $N_V$ are defined the same as in [5]).

Figure 1:
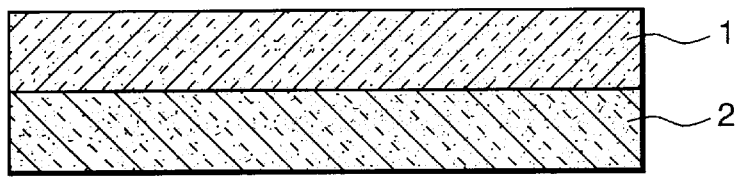
FIG. 1 is a sectional view showing a structure of a semiconductor according the present invention.

1 . . . N-type semiconductor layer

2 . . . Semiconductor layer having an energy value from vacuum level to Fermi level larger than the energy value from vacuum level to the lower end of the conduction band of the n-type semiconductor 1

2' . . . Semiconductor layer having an energy value from vacuum level to the lower end of the conduction band larger than the energy value from vacuum level to the lower end of the conduction band of the n-type semiconductor 1

3 . . . p-type semiconductor layer

4 . . . Semiconductor layer having an energy value from vacuum level to Fermi level smaller than the energy value from vacuum level to the lower end of the conduction band of the p-type semiconductor 3

5 . . . Substrate

6 . . . GaAs layer not doped (300 nm thick)

7 . . . Undoped $Al_{0.2}Ga_{0.8}As$ layer (500 nm thick) equivalent to the semiconductor layer 2 or the semiconductor layer 2' according to the invention 8 . . . Doped $Al_{0.2}Ga_{0.8}As$ layer (6 nm thick, doped with silicon at the rate of $3\times10^{18}/cm^3$) equivalent to the semiconductor layer 1 according to the invention 9 . . . Undoped $Al_{0.2}Ga_{0.8}As$ layer (2 nm thick)

10 . . . Undoped $In_{0.2}Ga_{0.8}As$ layer (15 nm thick) equivalent to the semiconductor layer 2 or the semiconductor layer 2' according to the invention 11 . . . Doped $Al_{0.2}Ga_{0.8}As$ layer (6 nm thick, doped with silicon at the rate of $3\times10^{18}/cm^3$ to $5\times10^{19}/cm^3$) equivalent to the semiconductor layer 1 according to the invention 12 . . . Undoped $Al_{0.2}Ga_{0.8}As$ layer (28 nm thick)

13 . . . Undoped GaAs layer (5 nm thick)

14 . . . Substrate

15 . . . Undoped GaAs layer (300 nm thick)

16 . . . Undoped $Al_{0.2}Ga_{0.8}As$ layer (500 nm thick) equivalent to the semiconductor layer 2 or the semiconductor layer 2' according to the invention 17 . . . Doped $Al_{0.2}Ga_{0.8}As$ layer (5 nm thick, doped with silicon at the rate of $3\times10^{18}/cm^3$) equivalent to the semiconductor layer 1 according to the invention 18 . . . Undoped $Al_{0.2}Ga_{0.8}As$ layer (2 nm thick)

19 . . . Undoped $In_{0.2}Ga_{0.8}As$ layer (15 nm thick) equivalent to the semiconductor layer 2 or the semiconductor layer 2' according to the invention 20 . . . Undoped $Al_{0.2}Ga_{0.8}As$ layer (2 nm thick)

21 . . . Doped $Al_{0.2}Ga_{0.8}As$ layer (5 nm thick, doped with silicon at the rate of $3\times10^{18}/cm^3$ to $2.4\times10^{19}/cm^3$) equivalent to the semiconductor layer 1 according to the invention 22 . . . Undoped $Al_{0.2}Ga_{0.8}As$ layer (15 nm thick)

23 . . . Undoped GaAs layer (5 nm thick)

24 . . . Substrate

25 . . . Doped GaAs layer (300 nm thick, doped with silicon at the rate of $5\times10^{18}/cm^3$) doped 26 . . . $In_{0.2}Ga_{0.8}As$ layer (15 nm thick, not doped or doped with silicon at the rate of $3\times10^{19}/cm^3$ to $6\times10^{19}/cm^3$) equivalent to the semiconductor layer 2 or the semiconductor layer 2' according to the invention 27 . . . Doped GaAs layer (10 nm thick, doped with silicon at the rate of $3\times10^{19}/cm^3$ to $6\times10^{19}/cm^3$) equivalent to the semiconductor layer 1 according to the invention

DETAILED DESCRIPTION OF THE INVENTION

Conventionally, the concentration of the donor impurities that can actively exist in an n-type semiconductor has been considered to have an upper limit determined according to the value expressed by equation (1) associated with the particular substance. The present inventors, however, have found that in an n-type semiconductor in contact with a substance having a different upper limit of donor concentration, the upper limit of donor impurities concentration of a semiconductor lower in the upper limit of donor impurities concentration can be increased by the action of a semiconductor with a higher upper limit of donor impurities concentration within the range in which electron transfer takes place through the junction (within the depletion layer).

In other words, the present inventors have found that when semiconductors having different Fermi levels are brought into contact with each other, the Fermi level is locally reduced in the semiconductor layer depleted by electron transfer and the self-compensation is not caused by the generation of a defect due to the Fermi level saturation mechanism, so that the donor impurities are effectively activated.

Specifically, the method of fabricating a semiconductor having an n-type semiconductor layer 1 with donor impurities added thereto as shown in FIG. 1 according to the present invention is characterized in that a semiconductor layer 2 having an energy value from vacuum level to Fermi level larger than the energy value from vacuum level to the lower end of the conduction band of the n-type semiconductor 1 with the donor impurities added thereto is junctioned with the n-type semiconductor 1, and donor impurities are doped in the depletion layer generated in the n-type semiconductor layer 1 in contact with the junction boundary.

This fabrication method can realize that the donor impurities concentration ($N_d$) in the depletion layer generated in the n-type semiconductor layer 1 in contact with the junction boundary is at least $2.7 \times 10^3 \exp\{-5.5(E_C - E_{FS})\} \times N_C$ (where each symbol is defined the same as mentioned above).

In this case, the thickness of the depletion layer of the n-type semiconductor layer is defined by a value obtained by dividing the total amount of electrons that have transferred from the n-type semiconductor layer 1 to the semiconductor layer 2 by the concentration of impurities doped into the n-type semiconductor layer 1.

This value is theoretically equivalent to the thickness of a portion in the semiconductor layer 1 in the neighborhood of the junction boundary with the semiconductor layer 2 where the electron density per unit of volume is preferably $10^{12}/cm^3$ or less, or more preferably $10^{15}/cm^3$ or less, or most preferably $10^{17}/cm^3$ or less in the electron density distribution obtained by solving Poisson's equation and the Schrodinger's wave equation self-consistently taking into consideration the conduction band structure, the layer thickness and the impurities distribution in the semiconductor layers 1 and 2.

Also, the method of fabricating a semiconductor according to the present invention is preferably such that in the method described above, the energy difference between vacuum level and the Fermi level is replaced by the energy difference between vacuum level and the bottom of the conduction band.

This fabrication method can realize that the donor impurities concentration ($N_d$) in the depletion layer generated in the n-type semiconductor layer 1 in contact with the junction boundary is at least $2.7 \times 10^3 \exp\{-5.5(E_C - E_{FS})\} \times N_C$ (where each symbol is defined the same as mentioned above).

Also, the ambient temperature for doping the impurities is preferably 550° C. or higher.

Further, the semiconductor comprising the n-type semiconductor 1 according to the present invention may include a compound semiconductor or an element semiconductor. The compound semiconductor may include a 3-5 group compound semiconductor or a 2-5 group compound semiconductor, and the element semiconductor may include a 4-group semiconductor or a mixed-crystal conductor thereof. The 4-group semiconductors specifically include diamond, Si and Ge.

Also, $Al_xGa_{(1-x)}As$ ($0 \leq x \leq 1$), $In_yAl_zGa_{(1-y-z)}As$ ($0 \leq y \leq 1$, $0 \leq z \leq 1$) or the like can be used as the semiconductor layer 1 according to the present invention.

Further, $In_yGa_{(1-y)}As$ ($0 \leq y \leq 1$) or the like can be used as the semiconductor layer 2 or the semiconductor layer 2' according to the invention.

It has become possible to dope donor impurities into a given n-type semiconductor with a concentration thus far impossible with the n-type semiconductor by bringing it into contact with another semiconductor layer having a proper energy band structure. It has also become possible to provide a epitaxial semiconductor substrate composed of two or more semiconductor layers including a semiconductor layer having such a high-concentration doped layer.

In this case, the concentration of donor impurities in the n-type semiconductor layer is at least $2.7 \times 10^3 \exp\{-5.5(E_C - E_{FS})\} \times N_C$. To take the full advantage of high concentration, however, the concentration of at least $3.9 \times 10^3 \exp\{-5.5(E_C - E_{FS})\} \times N_C$ is preferable. More preferably, the concentration is $5.0 \times 10^3 \exp\{-5.5(E_C - E_{FS})\} \times N_C$, and a most preferable concentration is $6.0 \times 10^3 \exp\{-5.5(E_C - E_{FS})\} \times N_C$ or more.

Also, a measure of the upper limit of electron density in the semiconductor layer 1 is provided by the maximum impurities concentration defined by equation (1) for the semiconductor layer 2 junctioned with the semiconductor layer 1. Apart from this, an upper limit of course is provided also by the metallurgical solution limit of the donor elements in the n-type semiconductor.

Furthermore, the thickness of the n-type semiconductor layer permitting the doping beyond the concentration limit indicated by equation (1) is within the thickness of the depletion layer generated in the portion in contact with the boundary. In the portion of the n-type semiconductor layer distant by more than the thickness of the depletion layer from the boundary, on the other hand, the effective donor concentration is saturated at an upper limit similar to that given by equation (1), and addition of a dopant of an amount equal to or more than the saturation value increases the inherent defects requiring compensation. This inherent defect adversely affects the quality of the semiconductor, and therefore the concentration of added impurities in the regions other than the depletion layer is preferably held at or less than the value given by equation (1).

The gist of the present invention lies in that in doping a high-concentration n-type semiconductor having a lower, a semiconductor Fermi level is brought into contact with the n-type semiconductor, so that the Fermi level of the n-type semiconductor layer is locally reduced within the depletion layer near the interface with the semiconductor having a lower Fermi level to suppress the generation of defects to be compensated. Thus a high-concentration doping which would be impossible with the single-layer semiconductor is realized.

Consequently, the semiconductor layer brought into contact with the n-type semiconductor for realizing the desired high-concentration doping may be a semiconductor layer having a Fermi level lower than the high-concentration doped layer. Such a semiconductor layer, therefore, may include the above-mentioned hetero-junction, a semiconductor layer with a low electron concentration, a semiconductor layer having a large amount of impurities or defects with an electron capture level deep in the forbidden gap, a surface of semiconductor layer having a surface level, or a p-type semiconductor layer.

The n-type semiconductor layer has been referred to in all of the above descriptions. Also, for the p-type semiconductor, unlike in the case of the n-type semiconductor, a high-concentration doping is locally realizable equal to or higher than the upper doping limit given by equation (2) within the depletion layer generated near the surface or the junction interface by bringing the p-type semiconductor with a higher Fermi level into contact with a system having a lower Fermi level.

Figure 2:
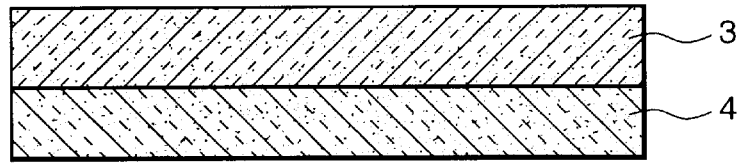
FIG. 2 is a sectional view showing a structure of a semiconductor according to the invention.

Specifically, according to the present invention, there is provided a method of fabricating a semiconductor comprising a p-type semiconductor layer 3 with acceptor impurities added thereto as shown in FIG. 2, characterized in that a semiconductor layer 4 having an energy value from vacuum level to Fermi level smaller than the energy value from vacuum level to the upper end of the valence band of the p-type semiconductor layer 3 with the acceptor impurities added thereto is junctioned with the p-type semiconductor layer 3, and acceptor impurities are doped within the range of the thickness of the depletion layer generated in the p-type semiconductor layer 3 in contact with the junction boundary.

In this case, the thickness of the depletion layer in the p-type semiconductor layer is defined as a value obtained by dividing the total amount of the holes that have transferred from the p-type semiconductor layer 3 to the semiconductor layer 4 by the concentration of the impurities doped into the p-type semiconductor layer 3.

This value is theoretically equivalent to the thickness of a portion in the semiconductor layer 3 in the neighborhood of the junction boundary with the semiconductor layer 4, where the hole density per unit of volume is preferably $10^2/cm^3$ or less, more preferably $10^{15}/cm^3$, or most preferably $10^{17}/cm^3$ or less, in the hole density distribution obtained by solving Poisson's equation and Schrodinger's wave equation self-consistently taking into consideration the valence band structure, the layer thickness and the impurities distribution of the semiconductor layers 3 and 4.

Also, according to the present invention, there is provided a method of fabricating a semiconductor, in which the energy value from vacuum level to Fermi level in the above-mentioned method is replaced by the energy value from vacuum level to the upper end of the valence band.

This fabrication method can realize the concentration ($N_a$) of acceptor impurities of at least $4.0 \times 10^3 \exp\{-6.1(E_{FS}-E_V)\} \times N_V$ (where each symbol is defined the same as mentioned above) within the range of thickness of the depletion layer generated in the p-type semiconductor layer 3 in contact with the junction boundary.

Also, the ambient temperature for doping the impurities is preferably 550° C. or higher.

Also, a semiconductor comprising a p-type semiconductor layer according to the invention may include a semiconductor illustrated above with reference to a semiconductor having the n-type semiconductor layer 1.

In similar fashion, $Al_xGa_{(1-x)}As$ ($0 \leq x \leq 1$), $In_yAl_zGa_{(1-y-z)}As$ ($0 \leq y \leq 1$, $0 \leq z \leq 1$) or the like can be used as the semiconductor layer 3 according to the invention, and $In_yGa_{(1-y)}As$ ($0 \leq y \leq 1$) or the like can be used as the semiconductor layer 4 according to the invention.

Also, instead of a single dopant, a plurality of dopants having different solution limits or different connection sites can be used at a time with equal effect.

EXAMPLES

The present invention will be explained in more detail below with reference to examples, although the invention is not limited to such examples.

Comparative Example 1

First, an n-type AlGaAs crystal was prepared in the manner described below by the metal organic CVD (MOCVD) with a semi-insulating GaAs single crystal as a substrate.

A substrate made of a GaAs single crystal having a clean surface which has a plane inclined by 0.4° in the direction of <0–11> from (100) plane is thermally cleaned in a mixed gas ambience of hydrogen gas and arsine in an epitaxial growth furnace.

After that, the arsine concentration in the ambience was adjusted to 0.83 mol % at 650° and $2.95 \times 10^{-3}$ mol % of trimethyl gallium was added to the ambience thereby to epitaxially grow a GaAs layer 50 nm thick. Further, $7.38 \times 10^{-4}$ mol % of trimethyl aluminum was added to epitaxially grow an $Al_{0.2}Ga_{0.8}As$ layer in the thickness of 300 nm.

Then, an n-type $Al_{0.2}Ga_{0.8}As$ layer 500 nm thick with $5.80 \times 10^{-7}$ mol % to $4.09 \times 10^{-5}$ mol % of disilane added thereto was epitaxially grown, after which a semiconductor crystal was retrieved from a cooled growth furnace.

In the process, the flow rate of the hydrogen gas used as a carrier gas was 45 SLM, and the epitaxial growth rate of the $Al_{0.2}Ga_{0.8}As$ layer was about 20 nm/min. In this process, 1 SLM (1 standard litter per minute) is defined as a gas flow rate of one litter per minute under the standard condition (0° C. and one atmosphere).

The crystal thus retrieved was cleaved into a piece about a 5-mm square. Indium dots were attached to the four corners of this rectangle, which was then annealed for five minutes at 350° C. in the hydrogen environment thereby to form an ohmic electrode. Then, electron concentration were measured by the Hall measurement(Van Der Pauw method) and thus the electron concentration was determined.

In this measurement, in order to avoid the effect of a deep defect level attributable to the donor impurities called the DX center specific to AlGaAs, a specimen immersed and cooled in liquid nitrogen was exposed to white light for one minute and subjected to Hall measurement. Another specimen prepared separately was subjected to secondary ion mass spectroscopy (SIMS) thereby to quantitatively analyze the Si atoms in the n-type $Al_{0.2}Ga_{0.8}As$ layer.

Figure 3:
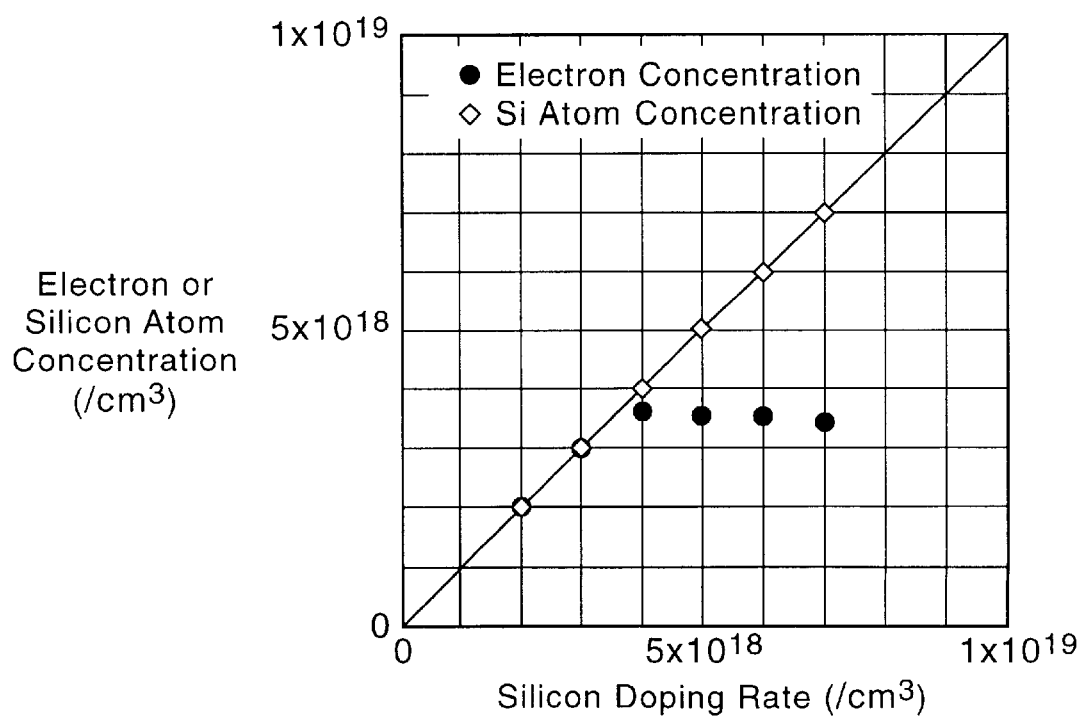
FIG. 3 is a diagram showing the relation between the electron concentration, the Si atom concentration and the silicon doping rate obtained in Example 1.

The relation between the electron concentration, the Si concentration and the silicon doping rate thus obtained is shown in FIG. 3. The abscissa represents the silicon doping rate which is represented by the disilane flow rate specified with the doping rate set to $2 \times 10^{18}/cm^3$ for the electron concentration of $2 \times 10^{18}/cm^3$. In other words, [Silicon doping rate]=$2 \times 10^{18}/cm^3 \times$ disilane flow rate/(disilane flow rate for n=$2 \times 10^{18}/cm^2$).

In a region with a comparatively small disilane doping rate and an electron concentration of not more than $3 \times 10^{18}/cm^3$ the doping rate and the electron concentration are proportional to each other. With an increase in the doping rate, however, the Si concentration based on SIMS continues to increase in proportion to the doping rate. Nevertheless, the electron concentration is saturated and has been found unable to increase beyond about $3 \times 10^{18}/cm^3$.

Also, an observation with photo-luminescence at 77K shows that the band-edge luminescence intensity for a specimen with a saturated electron concentration is reduced while the broad luminescence with a 1.32-eV band considered attributable to the complex defect of the Ga vacancy and the Si donors has been found to increase.

In the $Al_{0.2}Ga_{0.8}As$ layer, the maximum electron concentration predicted from equation (1) is $3.5 \times 10^{18}/cm^3$, which substantially coincides with the saturation value obtained experimentally.

Example 1

Figure 4:
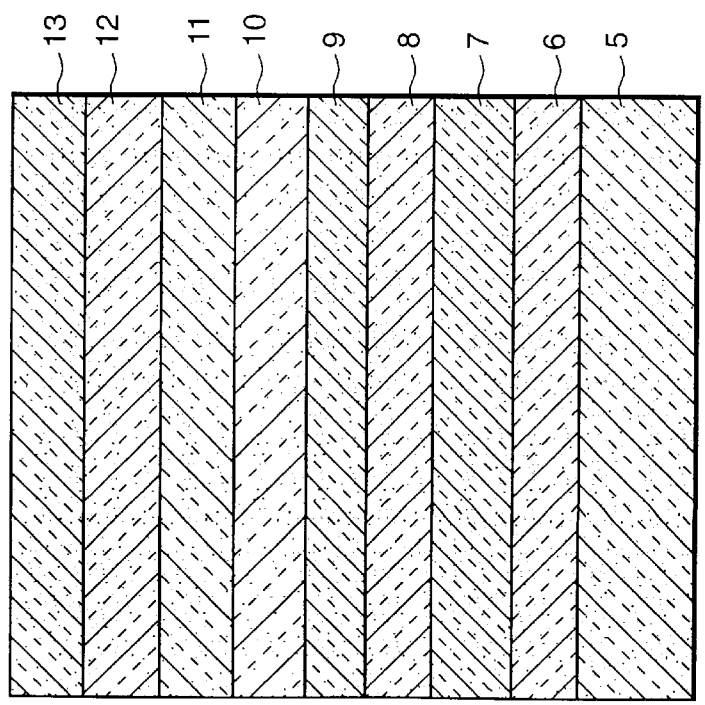
FIG. 4 is a sectional view of a hetero-junction crystal used in Example 1.

A hetero-junction crystal composed of a 3-5 group compound semiconductor having the structure shown in FIG. 4 was prepared.

The procedure and conditions for crystal growth are similar to those for the n-type $Al_{0.2}Ga_{0.8}As$ layer in Comparative Example 1 except for the fact that trimethyl indium was added as a raw material for epitaxial growth of the $In_{0.2}Ga_{0.8}As$ layer and the growth temperature of $In_{0.2}Ga_{0.8}As$ layer was set to 600° C.

The silicon doping rate in the n-type $Al_{0.2}Ga_{0.8}As$ layer shown in FIG. 4 was changed in the range of 3 to $6 \times 10^{18}/cm^3$ under the same condition as in Comparative Example 1.

The crystal thus obtained was subjected to Hall measurement in a manner similar to the n-type $Al_{0.2}Ga_{0.8}As$ layer described above thereby to determine the sheet electron concentration. Also, a specimen was prepared for measuring the capacitance-voltage characteristic in the manner described below.

A portion of the epitaxial crystal specimen was cleaved by about ¼ and retrieved, and the entire surface thereof was vapor-deposited with about 200 nm of aluminum metal. Then, the aluminum metal was separated into a circular portion 800 μm in diameter and the remaining portion 50 μm apart from the circular portion by photolithography. A pseudo-Schottky diode was prepared with a Schottky electrode formed of the circular portion and the opposite electrode of the remaining portion.

Using this diode, an electron concentration profile was determined by the capacitance-voltage method with a negative voltage applied to the Schottky electrode. The voltage value with the electron concentration reduced to $1 \times 10^{15}/cm^3$ was determined as a threshold voltage (Vt).

Next, the theoretical electrical characteristic of the epitaxial crystal prepared in the above-mentioned manner was determined in the following way. Specifically, on the basis of the structure obtained, the electron distribution of the structure was determined by solving Shroedinger's wave equation and Poisson's equation self-consistently. In the process, the GaAs surface level was assumed to be 0.9 eV from the lower end of the conduction band.

As a result of calculations, substantially all the electrons have been found to exist in the InGaAs quantum well. The sheet electron concentration Ns, then, was determined by integrating the electron concentration.

Then, while increasing the surface level in units of 0.01 eV, the sheet electron concentration Ns was determined for each increment. Assuming that the increase from the surface level of 0.9 eV is ΔV, the correlation between ΔV and Ns was determined. The value ΔV with Ns reduced to $10^{10}/cm^2$ was defined as the theoretical threshold voltage (Vt). The sheet electron concentration Vt and Ns at ΔV=0 were determined with the active donor concentration of the n-AlGaAs doped layer changed in the range of 2 to $6 \times 10^{18}/cm^3$. The result thus obtained is shown by solid lines in FIG. 5.

Figure 5:
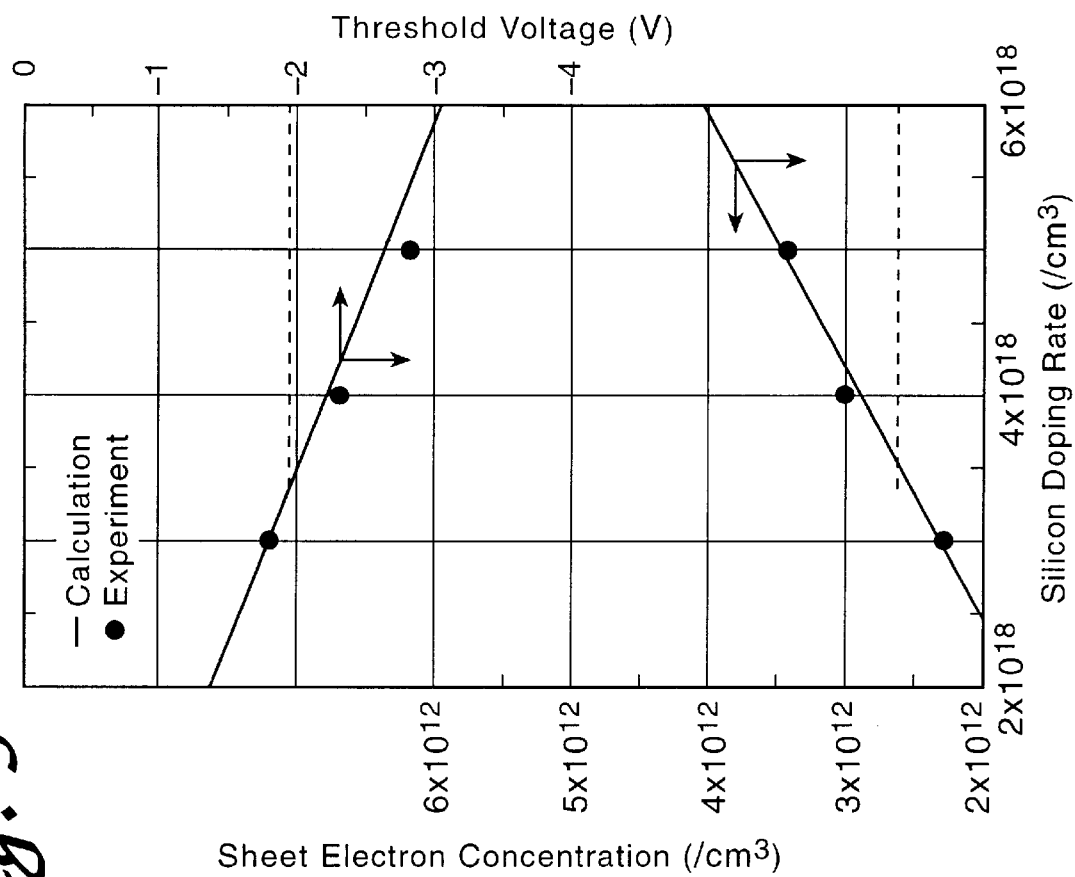
FIG. 5 is a diagram showing the relation between the the sheet carrier concentration, the sheet carrier concentration and the silicon doping rate for the hetero-junction crystal having the structure shown in FIG. 4 (where the solid lines represent calculated values, the dotted lines represent predicted values of Vt and Ns assuming an electron concentration saturation similar to that for the thick-film n-AlGaAs crystal, and the black circles represent experimental values).

The sheet electron concentration Ns obtained by Hall measurement and the value Vt obtained by the capacitance-voltage method are shown in FIG. 5 (closed circles). The conditions for crystal growth of the n-$Al_{0.2}Ga_{0.8}As$ crystal layer and the disilane doping rate are the same as those used for the thick film evaluation in Comparative Example 1. As long as the concentration of the n-AlGaAs doped layer is saturated in the neighborhood of $3 \times 10^{18}/cm^3$ as indicated by the result for the thick film in Comparative Example 1, the Ns value and the Vt value experimentally obtained should be constant as shown by dotted lines in the drawing. Actually, however, the experimental value was found to be proportional to the doping rate and substantially coincide with the calculated value.

This fact makes it obvious that the doping far in excess of the saturation concentration conventionally observed with the thick film was realized in the thin-film n-AlGaAs doped layer in contact with the InGaAs boundary.

Example 2

Figure 6:
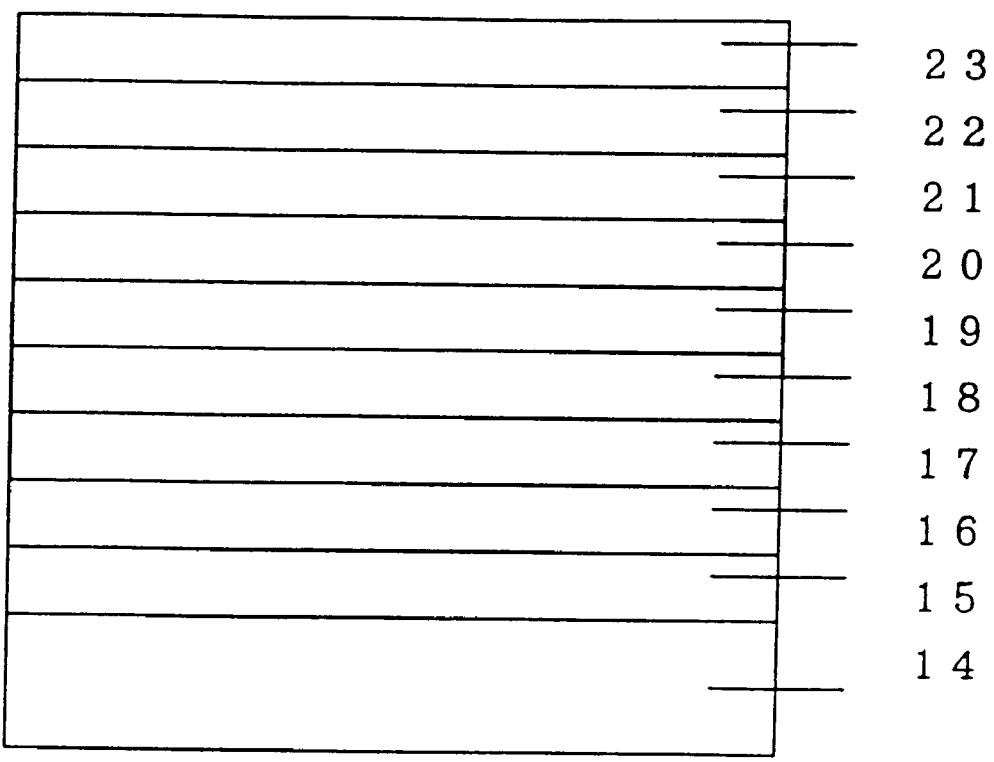
FIG. 6 is a sectional view of a hetero-junction crystal used in Example 2.

A hetero-structured crystal composed of a 3-5 group compound semiconductor having the structure shown in FIG. 6 was prepared.

The procedure and conditions for crystal growth are similar to those for Example 1. The rate of doping silicon in the n-type $Al_{0.2}Ga_{0.8}As$ in FIG. 6, however, was changed within the range of $3 \times 10^{18}/cm^3$ to $2.4 \times 10^{19}/cm^3$.

The crystal thus obtained was subjected to the Hall measurement in a manner similar to Example 1 to determine the sheet electron concentration (Ns).

Also, as in Example 1, the threshold voltage (Vt) was determined by the capacitance-voltage method.

Then, the theoretical value of the sheet electron concentration (Ns) and the threshold voltage (Vt) were determined by solving the Shroedinger wave equation and the Poisson equation self-consistently in a manner similar to Example 1 on the basis of the structure prepared as described above.

Figure 7:
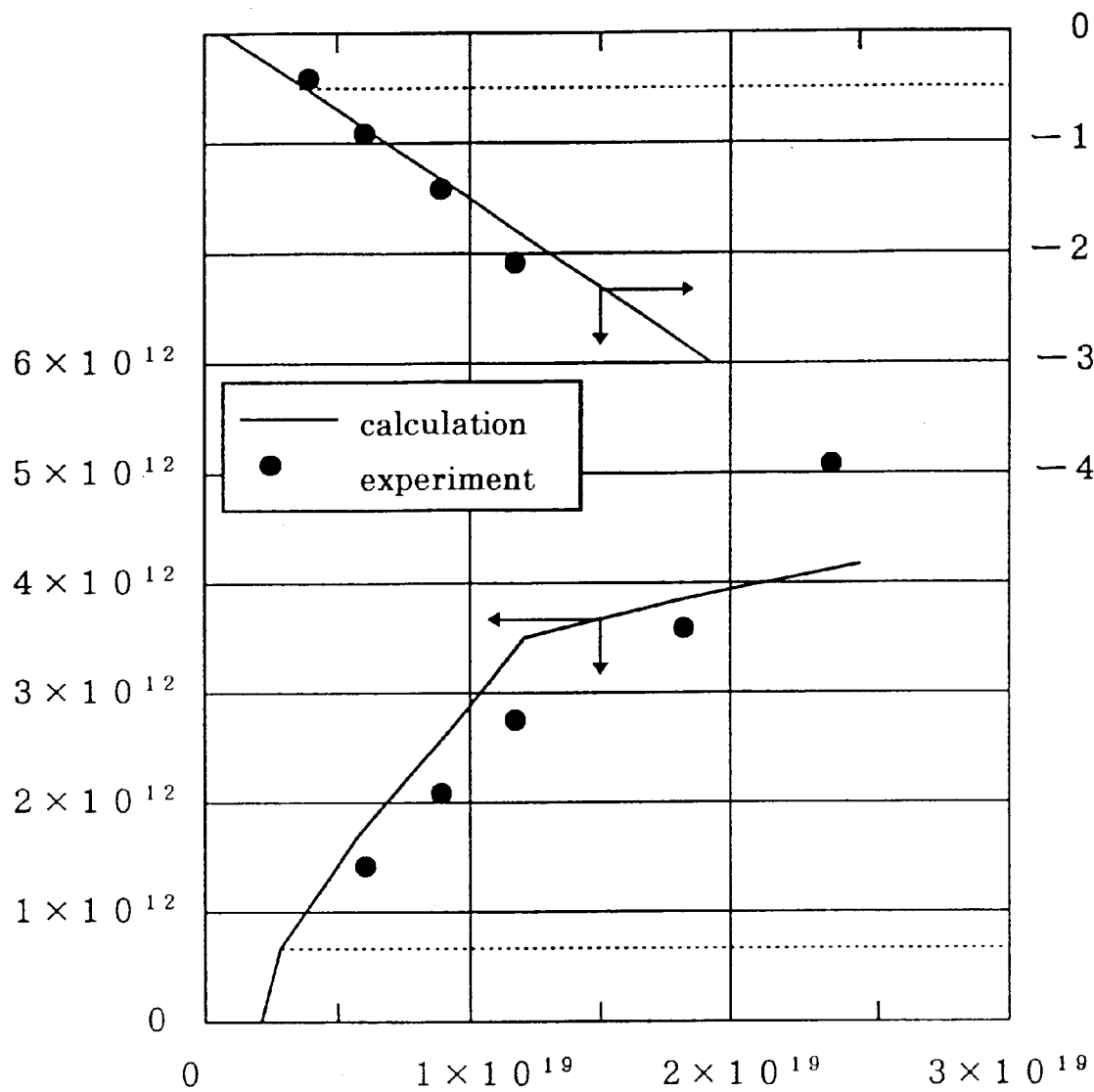
FIG. 7 is a diagram showing the relation between the sheet electron concentration (Ns), the threshold voltage (Vt) and the silicon doping rate for a hetero-junction crystal having the structure of FIG. 6 (where the solid lines represent calculated values, the dotted lines represent calculated values of Vt and Ns assuming an electron concentration saturation similar to that for the thick-film n-AlGaAs crystal, and the black circles represent experimental values.)

The sheet electron concentration Ns obtained by the Hall measurement and the value Vt obtained by the capacitance-voltage method are shown in FIG. 7 (black circles). Also, the Ns value and the Vt value obtained by calculations are shown by solid lines. The conditions for doping silicon in the n-type $Al_{0.2}Ga_{0.8}As$ are identical to those used for thick film evaluation in the comparative example. Assuming that the silicon doping concentration in the n-type $Al_{0.2}Ga_{0.8}As$ is saturated at about $3 \times 10^{18}/cm^3$ or thereabout as indicated by the result obtained with the thick film in the comparative example, the Ns value and the Vt value experimentally obtained should assume a constant value as indicated by dotted lines in FIG. 6. Actually, however, the experimental value has been found to increase substantially at the same rate as the calculated value with the increase in the doping rate.

This has made clear that the doping far exceeding the conventional observation with the thick film has been realized in the thin-film n-AlGaAs doping layer in the vicinity of the InGaAs boundary.

Example 3

Figure 8:
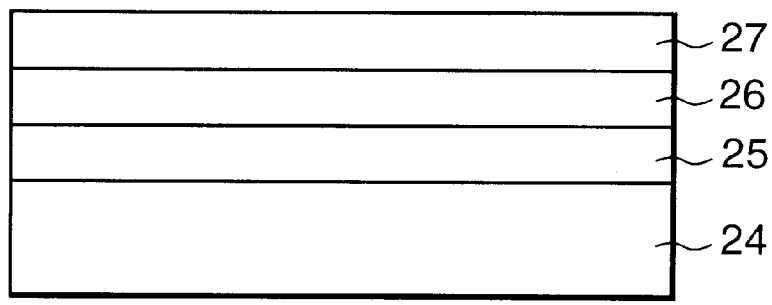
FIG. 8 is a sectional view of the hetero-junction crystal used in Example 3.

A hetero-structured crystal composed of a 3-5 group compound semiconductor having a structure shown in FIG. 8 was prepared.

The procedure and conditions for crystal growth are similar to those for Examples 1 and 2. The crystal layer structure, however, is composed of GaAs and $In_{0.2}Ga_{0.8}As$. The silicon doping concentration of the substrate-side GaAs layer was maintained constant at $3 \times 10^{18}/cm^3$, and the 12-nm thick $In_{0.2}Ga_{0.8}As$ layer was not doped or doped with silicon at the rate of $3 \times 10^{19}/cm^3$ or at the rate of $6 \times 10^{19/cm^3}$. The 10-nm thick n-type GaAs layer formed on this assembly, on the other hand, was doped with silicon at the rate of $3 \times 10^{19}/cm^3$ or at the rate of $6 \times 10^{19}/cm^3$.

Then, a variety of metal electrodes were mounted on the crystal thus prepared and the contact resistance was measured. Minutely, rectangular metal electrodes of 150 μm×100 μm in size were formed by photolithography and vacuum evaporation of the metal on the surface of a specimen crystal at spatial inter-electrode intervals of 5, 10, 15, 20, 25 and 30 μm. From the current-voltage measurements obtained with a 1-mA current supplied between the electrodes, the contact resistance value was determined by the TLM (transmission line method). The area up to the semi-insulative substrate portion other than the electrodes and those portions with the specified range of inter-electrode distance of 5 to 30 μm was removed by mesa etching. Three types of metal electrodes including Al (400 nm), Ti (50 nm)/Au (300 nm) and AuGe (600 nm)/Ni (200 nm)/Au (300 nm) were employed.

Also, an n-GaAs crystal 500 nm thick doped with silicon at the rate of $5 \times 10^{18}/cm^3$ was prepared as a reference specimen, so that metal electrodes were formed and the contact resistance measured in similar fashion. The measurement was conducted either immediately after forming the electrodes or after annealing for 90 seconds in a 380° C. hydrogen environment.

The measurements of the contact resistance are shown in Table 1.

TABLE 1

| /Specimen | | A (for reference) | B | C | D |
|---|---|---|---|---|---|
| Contact resistance (in $\times 10^{-5}$ Ω cm$^2$) | | | | | |
| Layer structure (doping concentration) | Upper GaAs | — | $3 \times 10^{19}$ | $3 \times 10^{19}$ | $6 \times 10^{19}$ |
| | In GaAs | — | — | $3 \times 10^{19}$ | $6 \times 10^{19}$ |
| | Lower GaAs | $5 \times 10^{18}$ | $5 \times 10^{18}$ | $5 \times 10^{18}$ | $5 \times 10^{18}$ |
| Electrodes not annealed | Al | — | 20.6 | 33.5 | 20.6 |
| | Ti/Au | High resistance | 4.0 | 3.9 | 3.5 |
| | AuGe/ Ni/Au | 778 | — | 3.9 | 3.9 |
| Electrodes annealed | Al | — | 25.0 | — | — |
| | Ti/Au | — | — | — | — |
| | AuGe/ Ni/Au | 3.8 | — | 5.5 | 4.2 |

An annealed AuGe/Ni/Au electrode is widely used as an ohmic electrode for n-GaS. In the case of GaAs, the silicon doping concentration is generally known to saturate at about 5 to $6 \times 10^{19}/cm^3$. In the specimen (A) having a silicon concentration approximate to this saturation value, when carrying the various metal electrodes shown in Table 1, the boundary of the semiconductor electrodes has such a high resistance as to be not conductive or has a high contact resistance. However, a satisfactory contact resistance of $3.8 \times 10-5$ Ω cm$^2$ could be obtained for the AuGe/Ni/Au electrode by annealing.

As shown in Table 1, in the case of the specimens (B, C, D) with a GaAs layer structure having a hetero junction with InGaAs and doped with high concentration (at the rate of higher than $1 \times 10^{19}/cm^3$), the use of Ti/Au and AuGe/Ni/Au not annealed was found to produce a contact resistance equivalent to that of the reference specimen A using the annealed AuGe/Ni/Au.

The GaAs is known to have a high-density surface states. In the boundary between a metal and GaAs, therefore, a Schottky barrier is generally known to develop due to the depletion layer formed in the semiconductor by the effect of surface states regardless of the type of the metal used as an electrode. For this reason, in order to form an ohmic contact, a thin boundary depletion layer is formed with high-concentration doping. In this way, the current flow is facilitated due to the tunnel effect, thereby effectively forming an ohmic contact. Normally, it is assumed that an ohmic contact can be produced in GaAs by doping at the rate of $2 \times 10^{19}/cm^3$ or more. In the annealed AuGe/Ni/Au, however, the Ge diffusion occurring in the annealing process is considered to cause the high-concentration doping in the neighborhood of the boundary thereby to form an ohmic contact.

With the specimens B, C and D, a contact resistance equivalent to the reference specimen using the annealed AuGe/Ni/Au electrode was obtained without annealing the metal electrodes thereof. This fact probably indicates that the structure shown in FIG. 8 realizes a high-concentration silicon doping that makes possible an ohmic contact in the epitaxial growth process.

Figure 9:
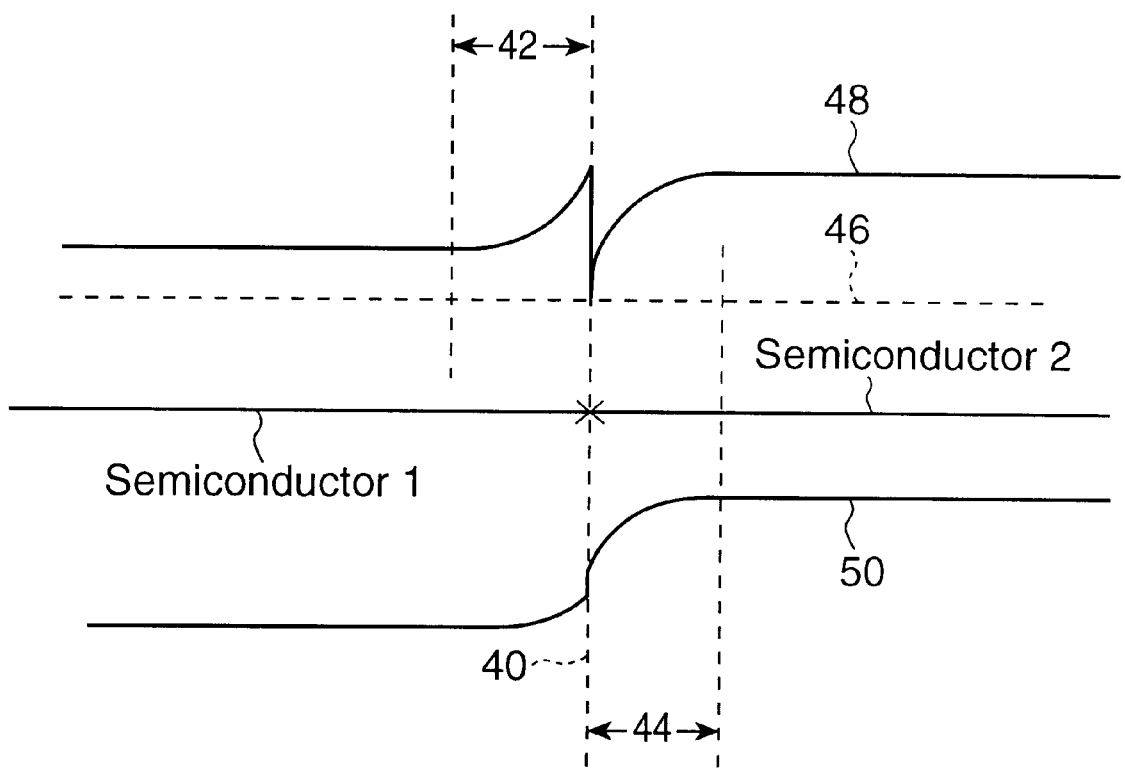
FIG. 9 is an energy level diagram illustrating relative energy levels in a semiconductor fabricated according to the present invention.

FIG. 9 is a diagram illustrating energy levels which are created when first semiconductor layer 1 and second semiconductor layer 2 are brought into contact to form a junction at an interface 40. Adjacent interface 40, semiconductor layer 1 will have a depletion layer 42 and semiconductor layer 2 will have a depletion layer 44. The two semiconductor layers will have Fermi level 46 which extends across the junction. The bottom of the resulting conduction band will have the form shown at 48, while the top of the resulting valence band will have the form shown at 50.

According to the present invention, a high-concentration impurities doping with a concentration equal to or more than the conventionally-known concentration value is possible, thereby making applications possible to high-performance hetero-junction devices having a high-concentration doped layer, an ohmic contact layer, devices utilizing the tunnel junction and other various semiconductor devices of which the development has thus far been hampered by the difficulty of high-concentration doping. The industrial significance of the invention, therefore, is very high.

What is claimed is:

1. A semiconductor comprising an n-type semiconductor layer (1), and a second semiconductor layer (2), said n-type semiconductor layer (1) and said second semiconductor layer (2) being in contact with one another to form a junction interface, said second semiconductor layer (2) having an energy difference between a vacuum level and its Fermi level (2) that is greater than the energy difference between the vacuum level and the Fermi level of the n-type semiconductor (1), said n-type semiconductor layer (1) having a depletion layer near the junction interface, wherein said depletion layer has a donor impurities concentration ($N_d$) that is greater than $$2.7 \times 10^3 \exp\{-5.5(E_C - E_{FS})\} \times N_C,$$

wherein ($E_C - E_{FS}$) is the energy difference in eV between the bottom of the conduction band of the n-type semiconductor layer (1) and the charge neutrality level of the n-type semiconductor layer (1), and $N_C$ is the effective density of states in cm$^{-3}$ of the conduction band of the n-type semiconductor layer (1).

2. A method of fabricating the semiconductor of claim 1, wherein said method comprises placing said n-type semiconductor layer (1) and said second semiconductor layer (2) in contact with one another to form the junction interface, and doping the n-type semiconductor layer in such a manner that the donor impurities concentration ($N_d$) in said depletion layer in the n-type semiconductor layer (1) is greater than $$2.7 \times 10^3 \exp\{-5.5(E_C - E_{FS})\} \times N_C.$$

3. A semiconductor comprising an n-type semiconductor layer (1), and a second semiconductor layer (2'), said second semiconductor layer (2') having an energy difference between its vacuum level and the bottom of a conduction band that is greater than the energy difference between the vacuum level and the bottom of the conduction band of the n-type semiconductor layer (1), said n-type semiconductor layer (1) and said second semiconductor layer (2') being in contact with one another to provide a hetero-junction interface, wherein said n-type semiconductor layer (1) has a depletion layer that is near the hetero-junction interface, wherein said depletion layer in said n-type semiconductor (1) has a donor impurities concentration ($N_d$) that is greater than $$2.7 \times 10^3 \exp\{-5.5(E_c - E_{FS})\} \times N_c$$

wherein ($E_c - E_{FS}$) is the energy difference in eV between the bottom of the conduction band of the n-type semiconductor (1), and the charge neutrality level of said n-type semiconductor layer (1), and $N_c$ is the effective density of states in $cm^{-3}$ of the conduction band of said n-type semiconductor layer (1).

4. A method of fabricating the semiconductor of claim 3, which method comprises forming said hetero-junction interface between said n-type semiconductor layer (1) and said second semiconductor layer (2'), and doping the n-type semiconductor layer (1) in such a manner that the donor impurities concentration ($N_d$) in said depletion layer in the n-type semiconductor layer (1) is greater than $$2.7 \times 10^3 \exp\{-5.5(E_C - E_{FS})\} \times N_C.$$

5. A semiconductor comprising a p-type semiconductor layer (3), and a second semiconductor layer (4), said p-type semiconductor layer (3) and said second semiconductor layer (4) being in contact with on another to form a hetero-junction interface, said second semiconductor layer (4) having an energy difference between a vacuum level and its Fermi level (4) that is smaller than the energy difference between vacuum level and the Fermi level of the p-type semiconductor layer (3), said p-type semiconductor layer (3) having a depletion layer that is near said hetero-junction interface, wherein said depletion layer in said p-type semiconductor layer (3) has an acceptor impurities concentration ($N_a$) that is greater than $4.0 \times 10^3 \exp\{-6.1(E_{FS} - E_v)\} \times N_v$, wherein ($E_{FS} - E_v$) is the energy difference in eV between the charge neutrality level and the top of the valence band, and $N_V$ is the effective density of states in $cm^{-3}$ of the valence band of said p-type semiconductor layer (3).

6. A method of fabricating the semiconductor of claim 5, which method comprises forming said hetero-junction interface between said p-type semiconductor layer (3) and said semiconductor layer (4), and doping the p-type semiconductor layer (3) in such a manner that the acceptor impurities concentration ($N_a$) in the depletion layer near the junction interface in the p-type semiconductor layer (3) is greater than $4.0 \times 10^3 \exp\{-6.1(E_{FS} - E_v)\} \times N_v$.

7. A method of fabricating a semiconductor according to claim 2, 4 or 6, wherein the doping is at an ambient doping temperature of at least 550° C.

8. A semiconductor according to in claim 1, 3 or 5, wherein said semiconductor is a 3-5 group compound semiconductor.

9. A method of fabricating a semiconductor according to claims 2, 4 or 6, wherein said semiconductor is a 3-5 group compound semiconductor.

10. A semiconductor according to claim 1, wherein said semiconductor layer (1) is made of $Al_xGa_{(1-x)}As$ in which $0 \leq x \leq 1$, and said semiconductor layer (2) is made of $In_yGa_{(1-y)}As$ in which $0 \leq y \leq 1$.

11. A semiconductor according to claim 3, wherein said semiconductor layer (1) is made of $Al_xGa_{(1-x)}As$ in which $0 \leq x \leq 1$, and said semiconductor layer (2') is made of $In_yGa_{(1-y)}As$ in which $0 \leq y \leq 1$.

12. A semiconductor according to claim 5, wherein said semiconductor layer (3) is made of $Al_xGa_{(1-x)}As$ in which $0 \leq x \leq 1$, and said semiconductor layer (4) is made of $In_yGa_{(1-y)}As$ in which $0 \leq y \leq 1$.

13. A method of fabricating a semiconductor according to claim 2, wherein said semiconductor layer (1) is made of $Al_xGa_{(1-x)}As$ in which $0 \leq x \leq 1$, and said semiconductor layer (2) is made of $In_yGa_{(1-y)}As$ in which $0 \leq y \leq 1$.

14. A method of fabricating a semiconductor according to claim 4, wherein said semiconductor layer (1) is made of $Al_xGa_{(1-x)}As$ in which $0 \leq x \leq 1$, and said semiconductor layer (2') is made of $In_yGa_{(1-y)}As$ in which $0 \leq y \leq 1$.

15. A method of fabricating a semiconductor according to claim 6, wherein said semiconductor layer (3) is made of $Al_xGa_{(1-x)}As$ in which $0 \leq x \leq 1$, and said semiconductor layer (4) is made of $In_yGa_{(1-y)}As$ in which $0 \leq y \leq 1$.

* * * * *